United States Patent [19]

Tsukamoto et al.

[11] Patent Number: 5,700,349
[45] Date of Patent: Dec. 23, 1997

[54] METHOD FOR FORMING MULTI-LAYER INTERCONNECTIONS

[75] Inventors: Masanori Tsukamoto; Tetsuo Gocho, both of Kanagawa, Japan

[73] Assignee: Sony Corporation, Tokyo, Japan

[21] Appl. No.: 585,772

[22] Filed: Jan. 16, 1996

[30] Foreign Application Priority Data

Jan. 20, 1995 [JP] Japan .................. 7-007072

[51] Int. Cl.$^6$ .................................. H01L 21/00
[52] U.S. Cl. .................... 156/657.1; 156/643.1; 156/644.1; 216/38; 437/228
[58] Field of Search ................ 156/636.1, 643.1, 156/644.1, 656.1, 657.1, 659.11; 216/18, 38, 67; 437/52, 228 PE, 228 ES, 228 S, 228 I, 228 MEM, 228 PL, 228 W

[56] References Cited

U.S. PATENT DOCUMENTS

| | | | |
|---|---|---|---|
| 5,246,883 | 9/1993 | Lin et al. | 216/18 X |
| 5,250,472 | 10/1993 | Chen et al. | 216/38 X |
| 5,308,793 | 5/1994 | Taguchi et al. | 437/228 |
| 5,573,633 | 11/1996 | Gambino et al. | 216/38 X |

*Primary Examiner*—William Powell
*Attorney, Agent, or Firm*—Hill, Steadman & Simpson

[57] ABSTRACT

A method of forming a multi-layer interconnection in which through-holes are formed in an interlayer insulating layer positioned between two neighboring mid interconnection layers, which through-hole is used for establishing an electrical interconnection between upper and lower interconnection layers, comprising the steps of forming an offset insulating film on said mid interconnection layer such that the patterns of the mid interconnection layer and the offset insulating film are the same; forming a sidewall insulating film on the lateral wall surface of a pattern made up of said mid interconnection layer and the offset insulating film; substantially conformally forming an etch stop layer covering the entire surface of the substrate, said etching stop layer being slower in etch rate than said interlayer insulating film; anisotropically etching said interlayer insulating film in a region having an opening size smaller than the spacing between the interconnecting layers; selectively removing the etching stop layer exposed on the bottom surface of said region for completing the through-hole; and filling said through-hole with an electrically conductive material.

16 Claims, 6 Drawing Sheets

METHOD FOR FORMING MULTI-LAYER INTERCONNECTIONS

BACKGROUND OF THE INVENTION

The present invention relates to methods for forming a multi-layer interconnection in a highly integrated semiconductor device, such as a memory or a gate array. More particularly, the invention relates to a method in which insulation between the interconnection and through-holes is provided to deal with further progress in integration despite slight dimensional variations in the interconnections or the through-holes or misalignment during photolithographic processing.

In present day highly integrated semiconductor devices, such as very large scale integration devices (VLSIs) and ultra large scale integration devices (ULSIs), the area taken up by the interconnections on a chip is increasing. This tendency is particularly great in devices such as memories and gate arrays. In these devices, there is a limit to which the chip size can be reduced if only a reduction in the intervals between the interconnections is considered. Accordingly, multi-layer interconnections consisting of vertical layering of plural interconnections, with insulating films in-between, are employed for addressing the problem.

In multi-layer interconnections, through-holes frequently are formed between the interconnections. For example, if there exist three layers in the interconnection, i.e., a lower interconnection layer, a mid interconnection layer and an upper interconnection layer, there are formed through-holes which extend through the spacings between neighboring interconnection layers and which are open on the lower interconnection layers. An electrically conductive material is embedded in these through-holes for establishing electrical connections between the lower interconnection layer and the upper interconnection layer. The distance between the mid interconnection layer and the through-hole is designed taking into account the following scaling factors:

(a) the distance required for insulating the mid interconnection layer and the through-hole;

(b) alignment tolerance in forming the through-hole pattern by photolithography; and (c) processing variations in the through-hole diameters or the interconnection widths.

The above scaling factor (a) is substantially the function of the film thickness and the dielectric constant of the interlayer insulating film present between the mid interconnection layer and the through-hole. The scaling factor (b) concerns the position deviation which is likely to be produced in the through-hole which should inherently be comprised in the spacing between the mid interconnection layers when forming a photo resist mask for opening a through-hole in the interlayer insulating film covering the mid interconnection layers. The scaling factor (c) is related to variations arising in the lithography process and critical dimensional loss attributable to etching conditions.

However, these scaling factors cannot necessarily be scaled down easily in proportion to the reduction in the design rule. This fact is obstructive to reduction in the spacing between the interconnection layers or reduction in the area taken up by the memory cell or the gate array. In particular, the alignment tolerance in photolithographic processing according to the scaling factor (b) cannot be scaled down as easily as the other scaling factors such that shorts frequently are produced between the mid interconnection layers and the through-hole with increases in the misalignment or, if the lower interconnection layer is the source/drain region of a MOS-FET, the through-hole reaches the LDD region to cause a deterioration in the operation of the interconnection.

In one technique for addressing the foregoing problem, there is proposed a so-called self-align contact method (SAC method) wherein a through-hole can be opened in a self-aligning manner even if the spacing between the interconnection layers is reduced. FIG. 11 illustrates a portion of a memory cell of an SRAM employing this technique. The SAC method is used for the process of contacting a bit-line lead-out electrode 22 with a source/drain region 8 having an LDD structure between two word lines 5 (gate electrodes of the MOS-FET) formed by polycide films. The source/drain region 8, word lines 5 and the bit line lead-out electrode 22 represent he above-mentioned lower interconnection layer, mid interconnection layer and upper interconnection layer, respectively.

On the upper surface of the word lines 5, an offset oxide film 6 formed of $SiO_x$ is formed with the same pattern as that of the word lines 5. A sidewall 7, similarly formed of $SiO_x$, is formed on each lateral wall surface of the word line 5 and the offset oxide film 6. The spacing between the interconnection layers of the two word lines 5 in its entirety operates as a contact hole, while the offset oxide film 6 and the sidewall 7 contribute to insulation between the word lines 5 and the bit line lead-out electrode 22.

The offset oxide film 6, which is a structural member peculiar to the SAC method, is of a certain film thickness such that it is a factor which renders the patterning of the contact hole or the bit line lead-out electrode 22 difficult by increasing the surface step difference on the substrate. The film thickness of the offset oxide film 6 is designed taking into consideration the following factors in addition to the factor of procuring a given withstand voltage:

(a) film thickness variations during film formation by CVD;

(b) decrease in film quantity caused by the formation of the sidewall 7 by etchback;

(c) decrease in film quantity caused by opening the contact hole in the interlayer insulating film 21; and (d) decrease in film quantity during dilute hydrofluoric acid processing directly before deposition of the upper interconnection layer 22.

The film thickness of the offset oxide film 6, designed taking these factors into consideration, significantly exceeds the film thickness of the word lines 5 in a majority of cases. On the other hand, since an opening edge 21e of the contact hole 23 is recessed from the edge of the word line 5 so as to allow for misregistration of the contact hole 23, an offset oxide film 6 is exposed during etching of the opening. However, since the interlayer insulating film 21 and the offset oxide film 6 usually are formed by $SiO_x$ films, such that the etching selection ratio cannot be set between the films 21 and 6, there is no alternative but to use controlled etching for etching the opening. Controlled etching is a method in which the etching quantity is set to approximately the same value as the film thickness of the etched layer in case the underlying layer selection ratio cannot be maintained such that excess overetching is avoided. Thus, with the usual SAC method, the interlayer insulating film 21 cannot be planarized in the vicinity of the word lines exhibiting significant step level differences, such that there is no choice but to conformally form the interlayer insulating layer 21. As a result, a complex surface step difference is left in the interior of the contact hole 23 such that difficulties are posed in patterning the upper interconnection layer for burying the contact hole 23. The reason is that the depth of focus is decreased in recent photo lithographic processing as a result of a reduction in wavelength of the exposing light and hence the step difference level leads significantly to the lowering in resolution. On the other hand, since vertically incident components of the etching species are intensified in present-day dry etching for realizing anisotropic etching, the surface difference leads to a decrease in film quantity or film damage caused by over-etching.

For improving patterning precision of the contact hole or the bit line lead-out electrode 22, it is effective that the substrate surface be planarized by the interlayer insulating film sheathing the word lines. In such case, however, a thin etching stop layer is used as an underlying layer for opening a contact hole in the interlayer insulating film exhibiting significant local film thickness variations. The etching stop layer is selected so as to exhibit an etching selection ratio with respect to the interlayer insulating film. FIG. 12 shows a part of a memory cell of an SRAM employing such technique. The offset $SiO_x$ film 6 and the sidewall $SiO_x$ film 7 are both sheathed by a thin etching stop layer 31, on which an interlayer insulating film 32 is formed for temporarily planarizing the substrate surface. As the etching stop layer 31 and as the interlayer insulating film 32, an SiN film and a boron phosphosilicate glass (BPSG) exhibiting superior planarizing characteristics may be employed, respectively. Subsequently, a resist mask 33 is formed by photolithography and the interlayer insulating film 32 is etched via an opening 34 formed in the resist mask 33. Since the etching at this time is carried out by wet etching using an HF solution in general or by dry etching of the isotropic mode in order to place emphasis on selectivity, an undercut $32u$ is produced at an opening edge of the interlayer insulating film 32, such that the opening size becomes larger than the opening size of the resist mask 33, that is the diameter of the opening 34. Subsequently, the etching stop layer 31 exposed on the bottom surface s removed by, e.g., treatment with a hot phosphoric acid solution, for completing the contact hole, as shown in FIG. 13.

With a memory cell, such as a DRAM or SRAM, the size of the opening 34 of the resist mask 33 may be inherently rather large so that generation of the undercut $32u$ due to isotropic etching, that is, enlargement of the opening diameter of the contact hole, was tolerated, as shown in FIG. 13.

However, for sheathing the contact hole having such isotropic shape, the bit line lead-out electrode needs to be formed with an increased width, thus possibly hindering future high integration by reason of predicted further reduction in the design rule. In particular, in a gate array in which a minimum processing size is applied to each gate electrode, the abovedescribed contact hole having the isotropic shape cannot be applied. On the other hand, an interconnection lead-out electrode sheathing the contact hole reflects the complex surface step difference. In addition, since the lead-out electrode sheathing the contact hole reflects the complex surface step difference, and is usually formed of a material exhibiting high light reflectance, halation or standing wave effects tend to be produced during photo lithographic processing, thus rendering correct resolution difficult.

There is therefore a need that the through-hole formed in the interlayer spacing of the mid interconnection layers be anisotropic in cross-section so as to diminish the coverage area of the upper interconnection layer and so as not to reflect the substrate surface step difference in the upper interconnection layer.

SUMMARY OF THE INVENTION

It is an object of the present invention to provide a method for forming a multi-layer interconnection capable of securing insulation between the mid interconnection layers and the through-hole despite further refinement of the design rule and also capable of coping with further increase in the integration degree.

In an embodiment of the invention, the method for forming a multi-layer interconnection by forming a through-hole through an interlayer insulating film in a spacing between interconnection layers of two neighboring mid interconnection layers for establishing electrical conduction between an upper interconnection layer and a lower interconnection layer via the through-hole, includes a step of forming an offset insulating film on the mid interconnection layer with the same pattern as the mid interconnection layer, a step of forming a sidewall insulating film on a lateral wall surface of a pattern made up of the mid interconnection layer and the offset insulating film, a step of substantially conformally forming an etching stop layer for covering the entire surface of the substrate, which etching stop layer is slower in the etch rate than the interlayer insulating film, a step of forming the interlayer insulating film so as to be substantially planar on the etching stop layer, a step of anisotropically etching the interlayer insulating film in a region having an opening size smaller than the spacing between the interconnecting layers, a step of selectively removing the etching stop layer exposed on the bottom surface of the region for completing the through-hole, and a step of filling the through-hole with an electrically conductive material.

The sidewall insulating film may also be formed by a material slower in etch rate than the interlayer insulating film instead of by the above-mentioned etching stop film. In such case, the through-hole is completed by solely carrying out anisotropic etching of the interlayer insulating film while the step of removing the etching stop film may be eliminated. If the through-hole is overlapped by the sidewall due to misalignment at the time of photo lithographic processing, the sidewall is not eroded because the sidewall performs the same functions as that of the etching stop film so that dielectric strength between the mid interconnection layer and the through-hole is maintained.

No matter which method is used, the most commonplace constituent material of the interlayer insulating film is an $SiO_x$ based material. If the $SiO_x$ based material is employed as the interlayer insulating material, such a material for which a selection ratio with respect to the $SiO_x$ based material can be taken needs to be used as a material for the etching stop layer or the sidewall insulating film. Among preferred candidate materials, there are $Si_xN_y$ based materials, $Si_xO_yN_z$ based materials and $Al_xO_y$ based materials.

The electrically conductive material to be filled in the through-hole may be the same material as that of the upper interconnection layer or some other material. Since the through-hole formed in accordance with the present invention is anisotropic in shape and opened on a substantially planar interlayer insulating film, it has necessarily a high aspect ratio. Therefore, if the upper interconnection layer itself is used for burying the through-hole, it is preferable to use an Al-based interconnection film formed by, e.g., a high temperature sputtering method or a high-pressure reflow method. If a material different from the material for the upper interconnection layer is employed as an electrically conductive material within the through-hole, it is preferable to form a W-plug within the through-hole by the combination of a blanket CVD step with an etchback step. In either case, it is possible to form a film of a Ti-based material which is excellent in coverage as an adhesive layer or a barrier metal in the through-hole.

Preferably, the opening size preferably is selected to be 1 to 1.2 times as large as the applicable minimum processing size. Since the formation of the through-hole pattern by photolithography both in general and within the scope of the present invention is accompanied by technical difficulties, the commonplace practice is to set the opening size of the through-hole so as to be slightly larger than the minimum processing size of the applicable generation. According to the present invention, the upper limit is set to be 1.2 times as large as the minimum processing size for coping with the tendency towards high integration of the gate array.

The mid interconnection layer and the lower interconnection layer may be the gate electrode and the source/drain electrode of a MOS transistor. Among the typical constituent materials of the gate electrode are an impurity-containing polysilicon film, a refractory metal polycide film and a refractory metal silicide film.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

According to the present invention, a planar interlayer insulating film and an anisotropic shape of the through-hole, which have not been possible to achieve with the conventional SAC method, may be realized even if slight misalignment of the photolithographic processing or variation in the processing dimension is incurred. By providing an etching stop layer below the interlayer insulating film or by constituting the sidewall by a material for which an etching selection ratio can be taken with respect to the interlayer insulating film, the interlayer insulating film exhibiting locally a large film thickness difference can be etched anisotropically, thus enabling a through-hole with an opening size smaller than the spacing between mid interconnection layers to be opened in the spacing. If the opening size of the through-hole is reduced, the area of coverage of the upper interconnection layer covering the through-hole may be reduced thus reducing the cell area of the memory cell or the gate array area taken up by the memory device thus achieving further high integration, i.e. higher integration. If the interlayer insulting film is substantially planarized, the photo resist film coated thereon is also planar and of uniform film thickness, so that the through-hole pattern or the pattern of the upper interconnection layer in photolithography may be significantly improved in resolution. Also, since the surface step difference in the upper interconnection layer may be minimized, the processing accuracy of the upper interconnection layer itself by etching may be improved simultaneously.

The present invention will now be described with reference to illustrative embodiments.

Embodiment 1

In a first embodiment, the present invention is applied to the process of forming a multi-layer interconnection of an SRAM configured for contacting the bit line lead-out electrode of the SRAM to the substrate between two word lines. An $Si_xN_y$ is formed as an etching stop layer. The forming process is explained reference to FIGS. 1 to 6.

Figure 1:
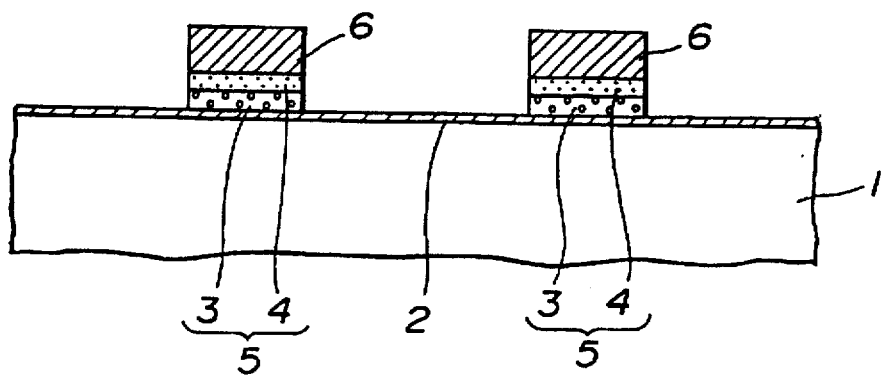
FIG. 1 is a schematic cross-sectional view showing an example in which the present invention is applied to a process for forming a multi-layer interconnection of an SRAM for contacting a bit line lead-out electrode with the substrate between two neighboring word lines, and specifically showing the state in which the word lines and the offset oxide film are formed to the same pattern on the Si substrate via a gate oxide film.

In this embodiment, the surface of an Si substrate 1, on which well formation and device isolation were previously performed, was thermally oxidized to form a gate oxide film 2 about 8 mm in thickness, as shown in FIG. 1. This thermal oxidation may be carried out by pyrogenic oxidation at 850° C. using, e.g., an $H_2/O_2$ mixed gas. Then, a W polycide film, which was comprised of an impurity-containing polysilicon film 3 with film thickness of approximately 70 nm and a WSi$_x$ film 4 with a film thickness of approximately 70 mm, layered together, was formed. On this W polycide film was deposited an offset oxide film 6 with a film thickness of approximately 170 nm by reduced-pressure CVD. The WSi$_x$ film 4 was formed by reduced-pressure CVD at 680° C. using a WF$_6$/SiCl$_2$H$_2$ mixed gas. The impurity-containing polysilicon film 3 was formed by crystal grain growth of an n$^+$amorphous Si film formed by reduced-pressure CVD at 550° C. under thermal load during CVD of the WSi$_x$ film 4.

On the offset oxide film 6, a resist mask, not shown, was formed for anisotropically etching the offset oxide film 6, WSi$_x$ film 4 and the impurity-containing polysilicon film 3. Although the anisotropic etching may be carried out under the common conditions for these three films using, e.g., a magnetic microwave plasma etching device and a Cl$_2$/O$_2$ mixed gas, these respective films may also be etched under respective optimum etching conditions which are switched from one gas to another. By this etching, the word line 5 in which the offset oxide films 6 have been layered with the same pattern was formed. The word line 5 had a line width of approximately 0.55 μm and the spacing between interconnection layers was approximately 0.7 μm.

Figure 2:
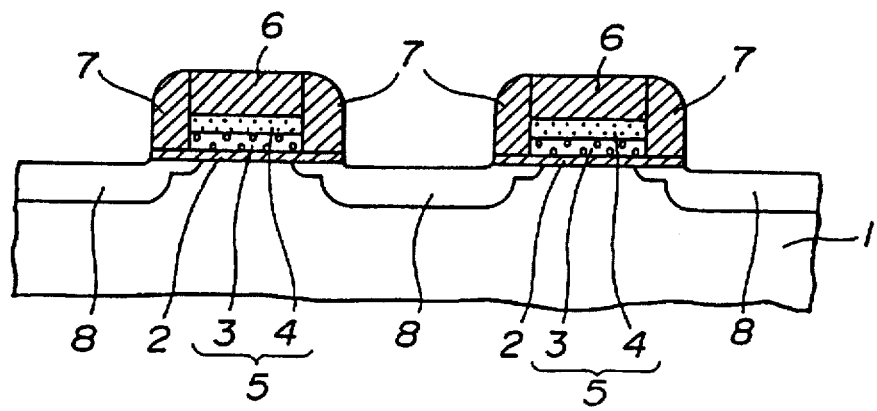
FIG. 2 is a schematic cross-sectional view showing the state in which a sidewall has been formed on the lateral wall surface of the word line and the offset oxide film shown in FIG. 1.

Then, using the offset oxide film 6 as a mask, As$^+$ions for forming an LDD region were implanted at lower concentration on the Si substrate 1, using the offset oxide mask 6 as a mask. The ion implantation conditions were set so that the ion acceleration energy was 20 keV and the dosage was 6×10$^{13}$/cm$^2$. On the entire substrate surface was then formed an SiO$_x$ film to a film thickness of approximately 150 nm by the reduced-pressure CVD method. The SiO$_2$ film thus formed was then etched back anisotropically. On the sidewall surface of the word line 5 and the offset oxide film 6 were then formed sidewalls 7 as shown in FIG. 2. Then, using the sidewalls 7 and the offset oxide film 6 as the mask, As$^+$ions were implanted at a high concentration with the ion acceleration energy of 20 keV and a dosage of 5×10$^{15}$/cm$^2$. The rapid thermal annealing (RTA) was then performed at 1050° C. for ten seconds for activating impurities (As) for forming a source/drain region 8 having the LDD structure.

Figure 3:
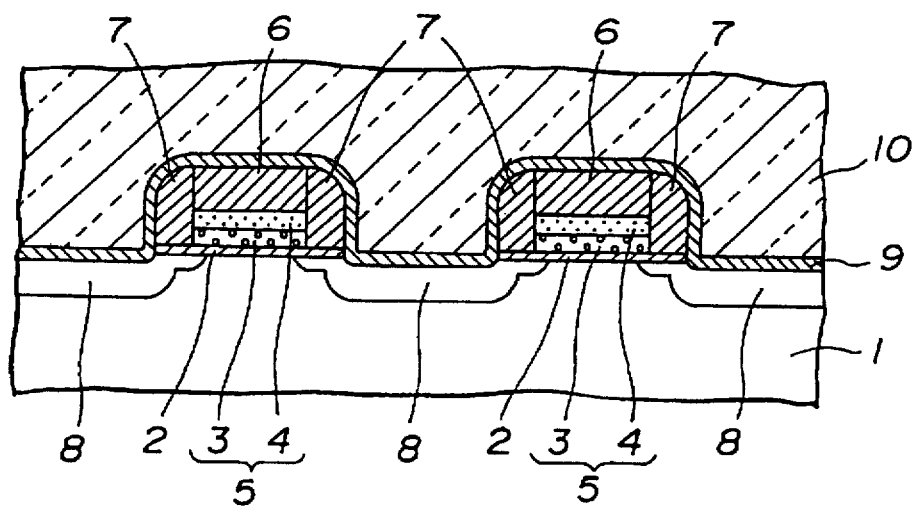
FIG. 3 is a schematic cross-sectional view showing the state in which a thin conformal etching stop layer is formed on the entire surface of the substrate shown in FIG. 1 and the substrate surface is substantially planarized with a thick interlayer insulating film.

Then, a thin etching stop layer 9 was conformally formed on the entire substrate surface, and subsequently, a thick interlayer insulating film 10 was deposited for substantially planarizing the entire substrate surface, as shown in FIG. 3. The etching stop layer 9 is an Si$_x$N$_y$ film deposited to a thickness of 20 to 50 nm by carrying out the reduced-pressure CVD at 760° C. using an SiCl$_2$H$_2$/NH$_3$ mixed gas. The etching stop layer 9 may also be formed by plasma CVD. The interlayer insulating film 10 is a boron phosphosilicate glass (BPSG) film which was deposited to a thickness of 500 to 1000 nm by carrying out ambient-pressure CVD at 400° C. and which subsequently was allowed to reflow at 850° C. for 30 minutes.

Figure 4:
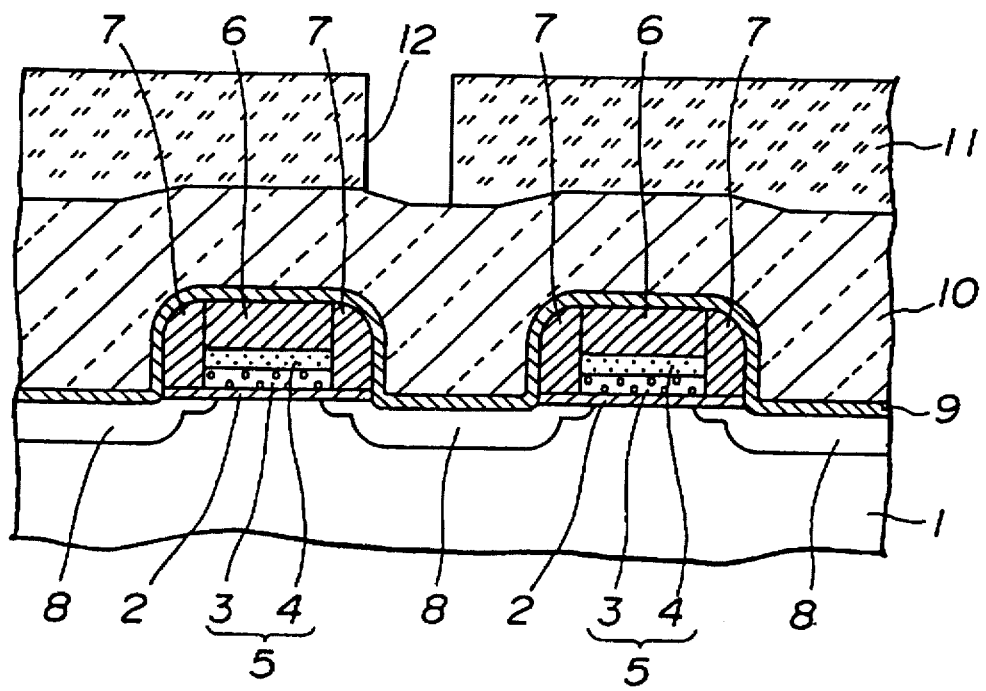
FIG. 4 is a schematic cross-sectional view showing the state in which a resist mask is formed on the interlayer insulating film of FIG. 3.

A resist mask 11 having an opening 12 conforming to the contact hole pattern was then formed by photolithography on the interlayer insulating film, as shown in FIG. 4. At that time, the opening size of the opening 12 was set to 0.4 μm narrower than the spacing between interconnection layers. The minimum processing size of the SRAM of the instant embodiment is 0.35 μm, so that the above opening size is 1.14 times as large as this processing size. The photo lithographic processing was carried out using, e.g., a photo resist material of the chemical amplification system and a KrF excimer laser stepper. The resolution characteristics were highly satisfactory because the surface of the interlayer insulating film 10 was previously substantially planarized and the resist coating film was rather thin in thickness and could be substantially uniform over the entire substrate surface.

Figure 5:
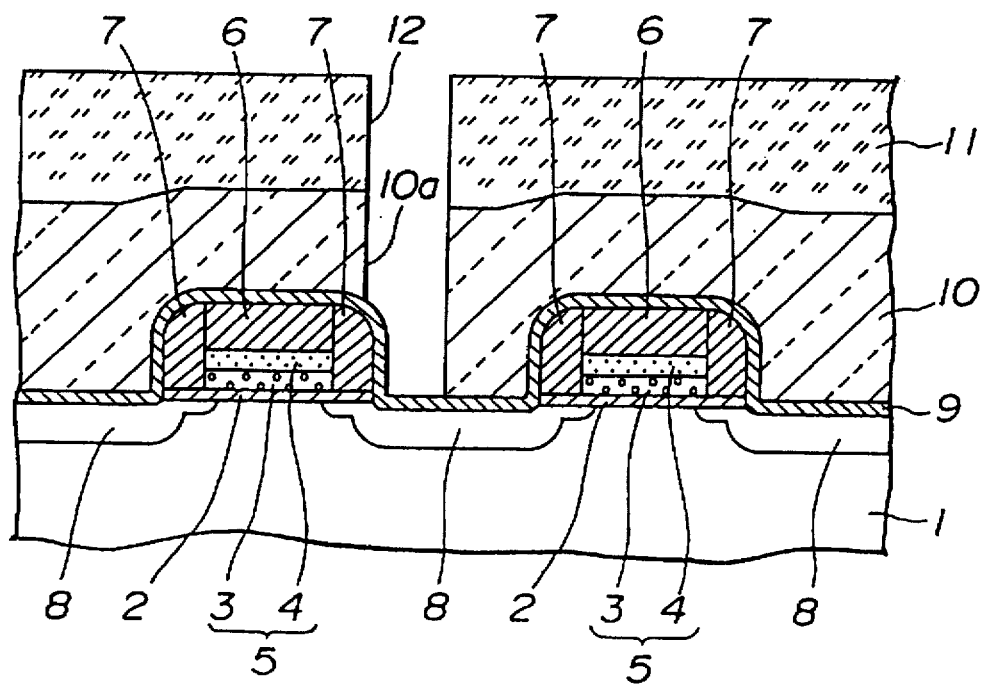
FIG. 5 is a schematic cross-sectional view showing the state in which the interlayer insulating film is anisotropically etched for forming a contact hole up to its mid portion.

Then, the interlayer insulating film 10, exposed in the opening 12, was anisotropically etched and a contact hole 10a was formed up to its mid portion, as shown in FIG. 5. This anisotropic etching was carried out using, e.g., a magnetron RIE device and a CHF$_3$/CO mixed gas. This gas system, while showing an effect with respect to the SiO$_x$ based material of raising the etch rate by extraction of O-atoms from within the film by the CO gas, shows an effect of lowering the etch rate on the exposed surface of the Si$_x$N$_y$ system not supplied with O atoms, because the CO gas captures F* (fluorine radicals). That is, due to the high selection ratio with respect to the etching stop layer 9, etching proceeds no further if the etching stop layer 9 becomes exposed, even although the interlayer insulating film 10 is etched in an amount corresponding to its maximum film thickness. FIG. 5 shows an example in which slight misalignment has been produced and the contact hole 10a has its one end slightly overlapped with the sidewall 7. The sidewall 7 is prohibited from corroding due to the presence of the etching stop layer 9. Thus, the word line 5 is insulated with a sufficient dielectric strength from the upper layer interconnection 15 buried in the inside of the contact hole 10a, as explained later.

Figure 6:
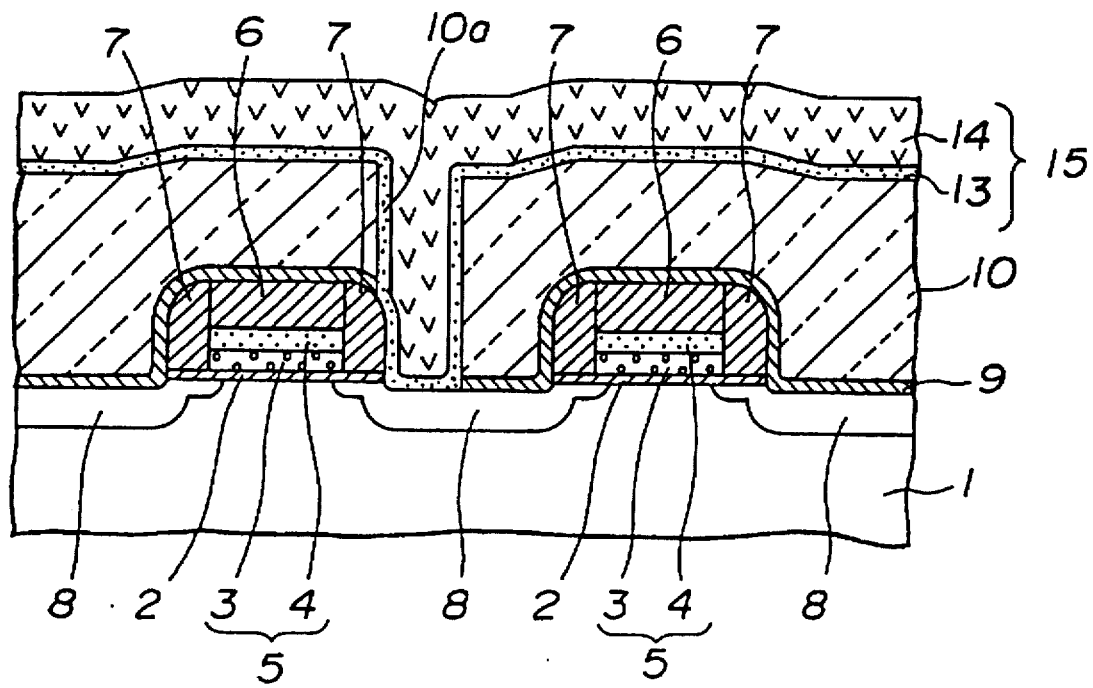
FIG. 6 is a schematic cross-sectional view showing the state in which the etching contact layer on the bottom surface of the contact hole of FIG. 5 is removed and the contact hole has been buried with an upper interconnection layer.

The etching stop layer 9, exposed on the bottom surface of the contact hole 10a, was removed by dry etching for completing the contact hole 10a, as shown in FIG. 6. This dry etching was carried out using, e.g., a magnetron RIE device and a CHF$_3$/O$_2$ mixed gas. With this gas system, if the addition amount of O$_2$ is increased, dissociation of the CHF$_3$ gas is accelerated to yield a large quantity of F*, while the amount of the CF$_x^+$yielded is lowered, so that a high selection ratio can be achieved with the SiO$_x$ based material. As for the Si substrate 1 (more precisely, the source/drain region 8), its exposed surface is changed into a thin SiO$_x$ film due to the oxidizing operation of O$_2$, so that a high selection ratio is similarly achieved.

The upper interconnection layer 15 was then formed as conventionally. This upper interconnection layer 15 was formed by layering a Ti film with a film thickness of approximately 30 nm and a TiN film with a film thickness of approximately 70 nm in this order by sputtering on a Ti-based barrier metal 13 and subsequently layering an Al-1%Si film 14 thereon with a film thickness of approximately 4000 nm by high-temperature sputtering. Although the upper interconnection layer 15 is shown in FIG. 6 as having been deposited on the entire substrate surface, it is actually patterned in a perpendicular direction relative to the word line 5 with a line width of 0.55 μm. Such narrow line width could be realized because the opening size of the contact hole 10a formed in accordance with the present invention is small such that a smaller covering area of the upper interconnection layer 15 at the opening and suffices. Also, since the upper interconnection layer 15 is formed on the substantially planarized interlayer insulating film 10, photo lithographic processing for patterning the upper interconnection layer 15 and dry etching could be performed with high accuracy.

Embodiment 2

In a second embodiment, a sidewall formed by an Si$_x$N$_y$ film was employed in place of the etching stop layer 6 employed in the first embodiment, embodiment 1. The process of the present embodiment is explained by referring to FIGS. 7 to 10. The parts common to those of the embodiment 1 are not explained specifically.

Figure 7:
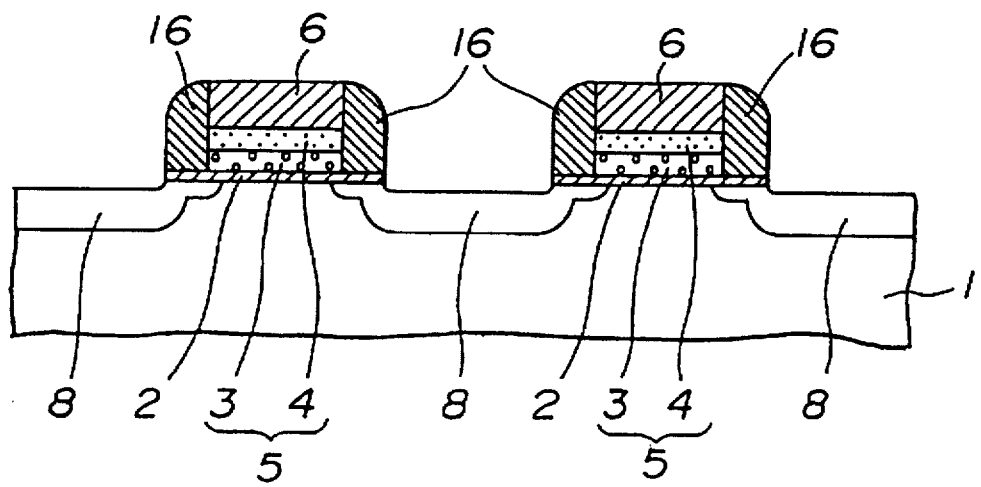
FIG. 7 is a schematic cross-sectional view showing another example in which the present invention is applied to a process for forming a multi-layer interconnection of an SRAM for contacting a bit line lead-out electrode with the substrate between two neighboring word lines, and specifically showing the state in which a sidewall having a lower etch rate than with an interlayer insulating film showing in FIG. 8.

In this second embodiment, a sidewall 16 formed by an Si$_x$N$_y$ film was formed, as shown in FIG. 7. This sidewall 16 was formed by carrying out the process up to LDD ion implantation in the same way as in embodiment 1, followed by reduced-pressure CVD at 760° C. with the use of, e.g., $SiCl_2H_2/NH_3$ mixed gas for forming an $Si_xN_y$ film with a film thickness of 80 nm on the entire substrate surface, followed by anisotropic etchback.

Figure 8:
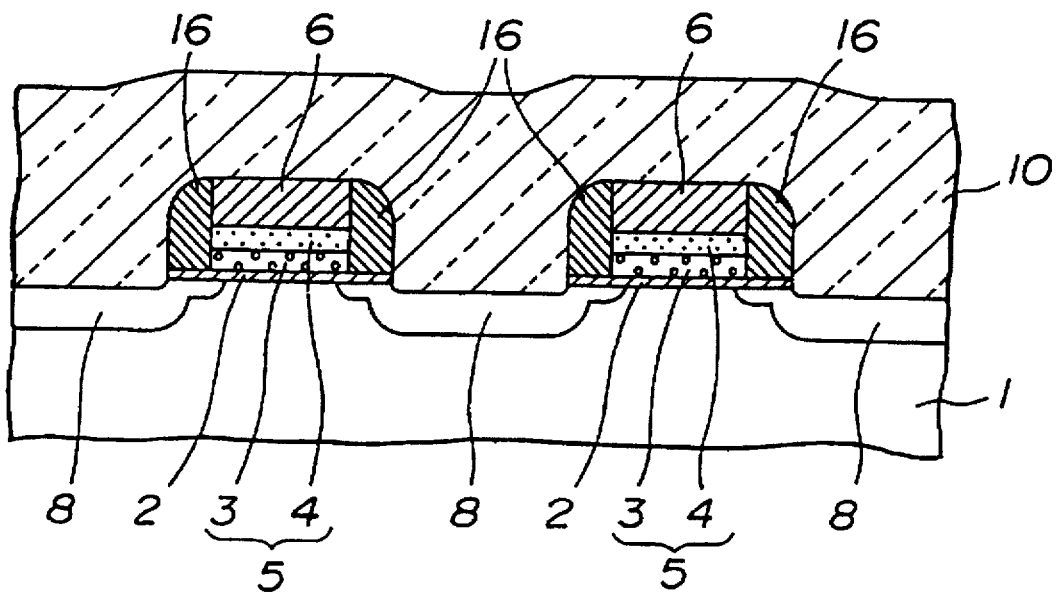
FIG. 8 is a schematic cross-sectional view showing the state in which the entire surface of the substrate of FIG. 7 is substantially planarized with a thick interlayer insulating film.
Figure 9:
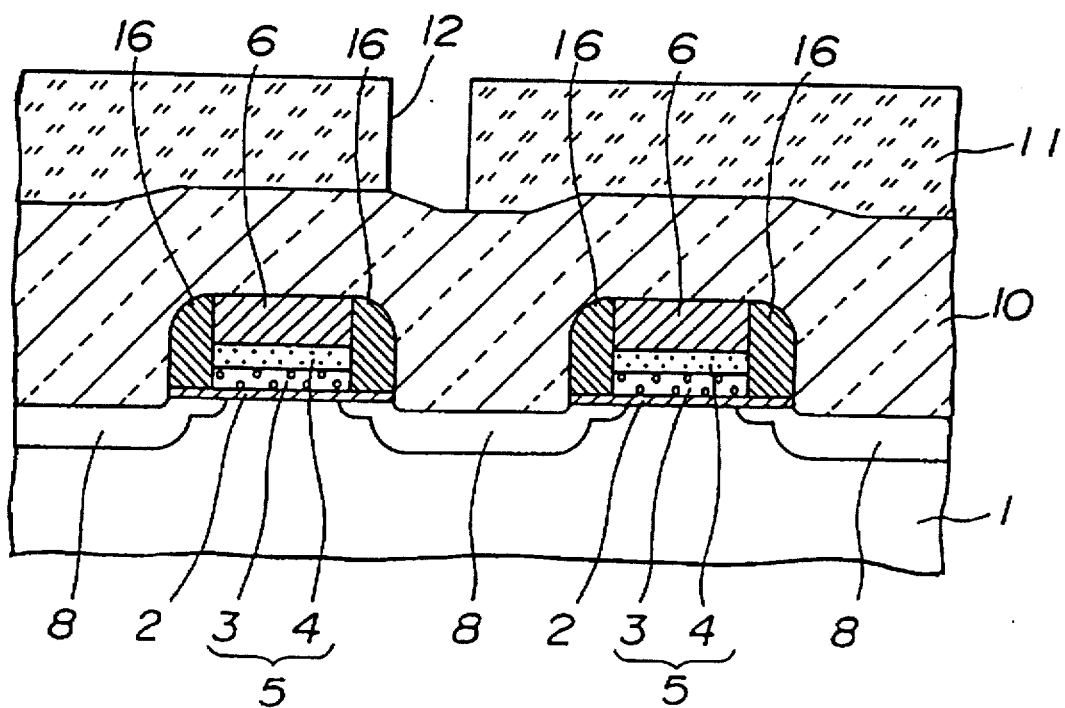
FIG. 9 is a schematic cross-sectional view showing the state in which the interlayer insulating film is anisotropically etched for forming a contact hole.
Figure 10:
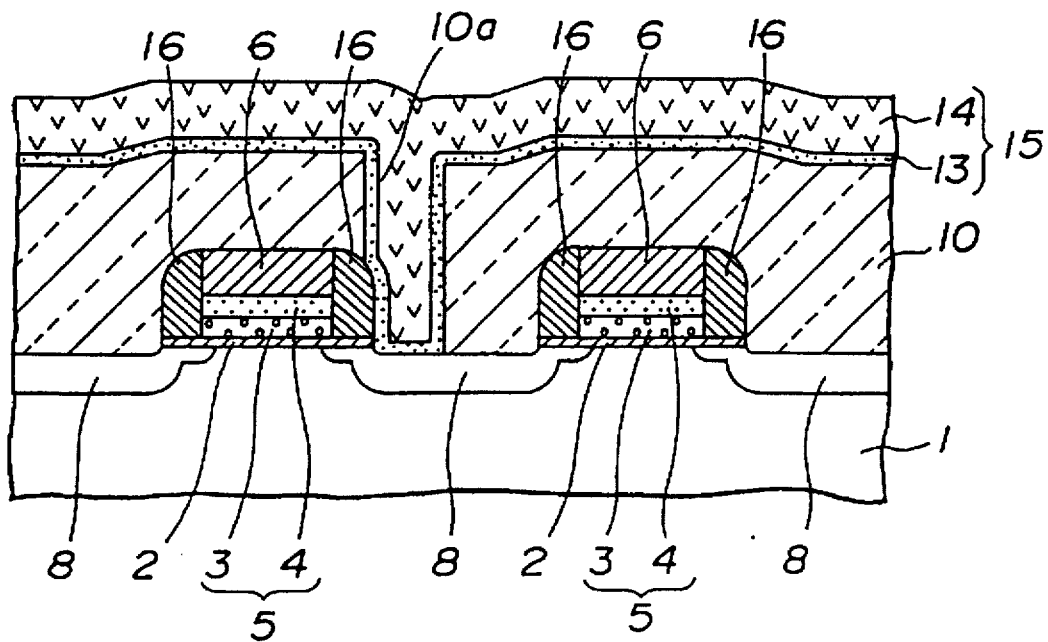
FIG. 10 is a schematic cross-sectional view showing the state in which the interlayer insulating film was anisotropically etched to form a contact hole.
Figure 11:
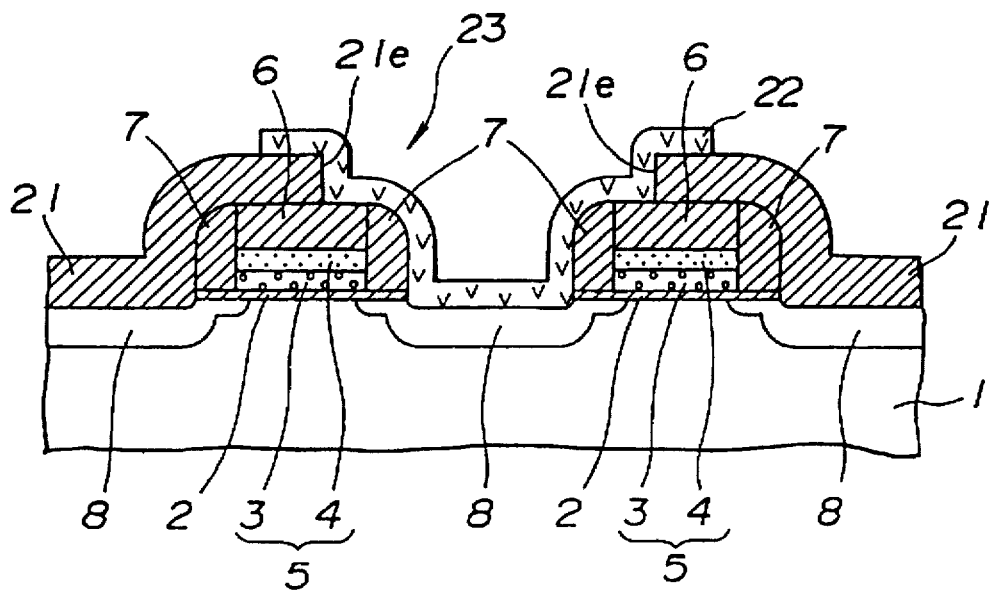
FIG. 11 is a schematic cross-sectional view showing the state in which, in a portion of a memory cell to which a SAC method is applied, the bit line lead-out electrode is contacted with the substrate using the spacing between neighboring interconnection layers between two neighboring word lines in its entirety.
Figure 12:
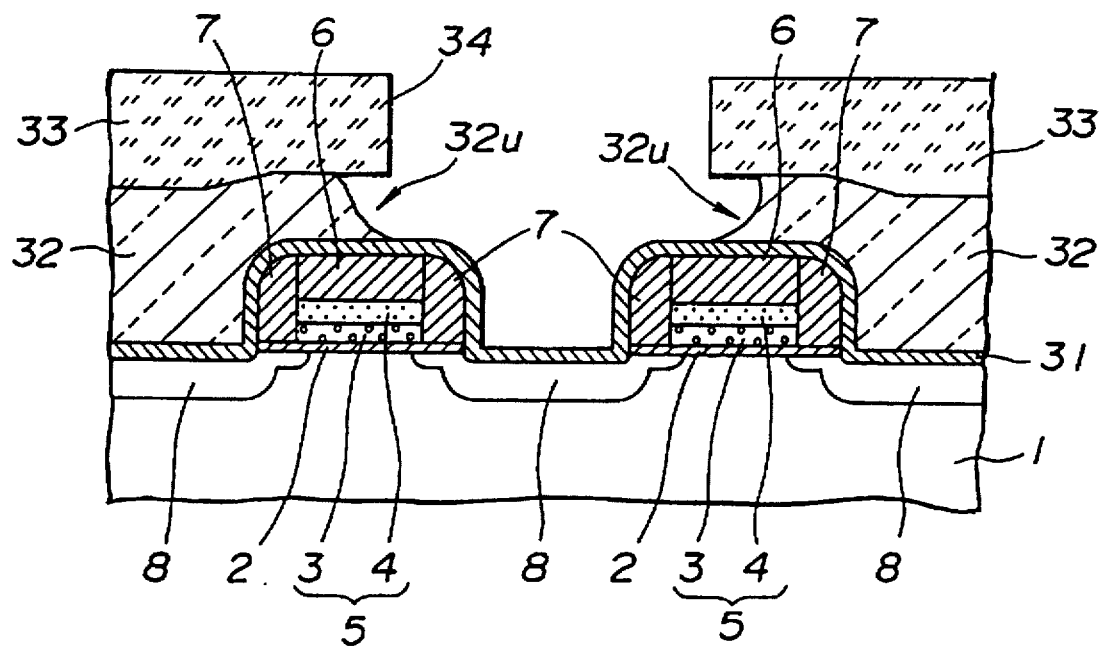
FIG. 12 is a schematic cross-sectional view showing the state in which, in a portion of an SRAM memory cell to which the conventional SAC method aimed at planarizing the interlayer insulating film using an etching stop payer, the cross-sectional shape of the through-hole has become isotropic and the opening size has been enlarged.
Figure 13:
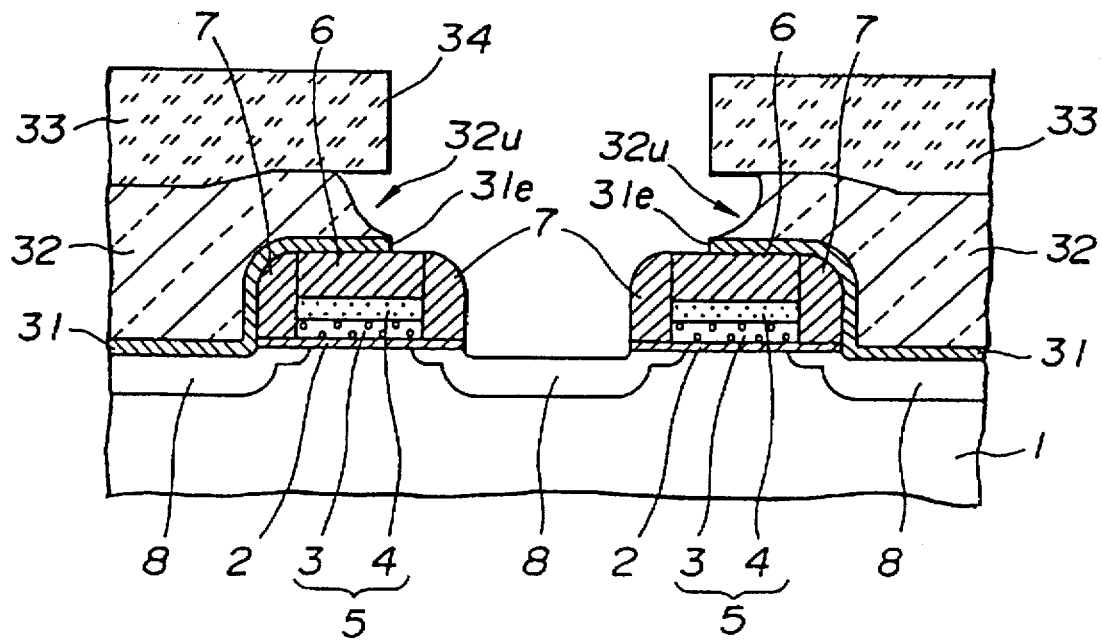
FIG. 13 is a schematic cross-sectional view showing the state in which the etching stop layer of FIG. 12 has been selectively eliminated.

The source/drain region 8 was formed by ion implantation with high concentration and activating annealing. The interlayer insulating film 10 formed of BPSG was then formed for substantially planarizing the substrate surface, as shown in FIG. 8. The resist mask 11 was then formed on the interlayer insulating film 10, as shown in FIG. 9. The interlayer insulating film 10 was then anisotropically etched under this condition for forming the contact hole 10a as shown in FIG. 10. Although FIG. 10 shows an example in which slight misalignment was caused such that an end portion of the contact hole 10a was overlapped with the sidewall 16, this sidewall 16, formed by $Si_3N_4$ film, displayed the effect which was the same as that of the etching stop layer 9 of the embodiment 1, and obstructed the progress of etching. That is, since erosion of the sidewall 16 was prohibited, the insulation between the word line 5 and the upper interconnection layer 15 within the contact hole 10a was not impaired even after the inside of the contact hole 10a was filled by the upper interconnection layer 15.

Although the present invention has been described with reference to two embodiments thereof, the present invention is not limited to these merely illustrative embodiments. For example, although the etching stop layer 9 and the sidewall 16 were both formed by $Si_xN_y$ in both of these embodiments, basically the same effects can be realized if the $SiO_xO_y$ or $Al_xO_y$ based material as prescribed in the present invention were used. In addition, the various devices to which the present invention is applied, various operating conditions for CVD, sputtering, ion implantation or dry etching, or the constituent materials, may be suitably modified within the scope of the invention.

It can be appreciated from the foregoing that, by application of the present invention, sufficient dielectric strength between the mid interconnection layer and the through-hole can be maintained while the spacing between the interconnection layers is diminished, while planarization of the interlayer insulting film and the anisotropic cross-sectional shape of the through-hole, with consequent reduction in the coverage area of the upper interconnection layer, which has been difficult to achieve with the conventional SAC method, may now be achieved. Consequently, the cell area of the memory device and the area taken up by the gate array may be reduced, while further integration and operational reliability of the semiconductor devices may also be achieved.

Although modifications and changes may be suggested by those skilled in the art, it is the intention of the inventors to embody within the patent warranted hereon all changes and modifications as reasonably and properly come within the scope of their contribution to the art.

What is claimed is:

1. A method of forming a semiconductor device having a multi-layer interconnection in which through-holes are formed in an interlayer insulating layer positioned between two neighboring mid interconnection layers, which through-holes are used for establishing an electrical interconnection between upper and lower interconnection layers, comprising the steps of:

forming an offset insulating film on said mid interconnection layer such that the patterns of the mid interconnection layer and the offset insulating film are the same;

forming a sidewall insulating film on a lateral wall surface of a pattern made up of said mid interconnection layer and the offset insulating film;

substantially conformally forming an etching stop layer covering the entire surface of the semiconductor device, said etching stop layer being slower in etch rate than said interlayer insulating layer;

forming the insulating film so as to be substantially planer and so as to cover the entire surface of said semiconductor device for completing a through hole; and anisotropically etching said interlayer insulating layer in a region having an opening size smaller than the spacing between the interconnecting layers;

selectively removing the etching stop layer exposed on the bottom surface of said region for completing the through-hole; and filling said through-hole with an electrically conductive material.

2. The method as claim in claim 1, wherein said interlayer insulating layer is formed of an $SiO_x$ based material and wherein said etching stop layer is formed using at least one insulating material selected from the group consisting of an $Si_xN_y$ based material, an $Si_xO_yN_z$ based material and an $Al_xO_y$ based material, wherein x, y and z are whole numbers.

3. The method as claimed in claim 1, wherein the opening size of said through-hole is 1 to 1.2 times the applicable minimum processing size.

4. The method as claimed in claim 1, wherein the mid interconnection layer and the lower interconnection layer are a gate electrode and a source/drain region of a MOS transistor, respectively.

5. The method as claimed in claim 1, wherein said electrically conductive material is the same material of the upper interconnection layer.

6. The method as claimed in claim 1, wherein said electrically conductive material comprises an Al-based material.

7. The method as claimed in claim 1, wherein said electrically conductive material is different than that of the upper interconnection layer.

8. The method as claimed in claim 7, wherein said electrically conductive material comprises a W-plug.

9. The method as claimed in claim 1, further comprising a step of forming a film in the through-hole to obtain an excellent coverage.

10. A method for forming a semiconductor device having a multi-layer interconnection by forming a through-hole by boring through an interlayer insulating film in a spacing between interconnection layers of two neighboring mid interconnection layers for establishing electrical conduction between an upper interconnection layer and a lower interconnection layer via said through-hole, comprising the steps of:

forming an offset insulating film on said mid interconnection layer with the same pattern as the mid interconnection layer;

forming a sidewall insulating film on the lateral wall surface of a pattern made up of said mid interconnection layer and the offset insulating film, said sidewall insulating film being slower in etch rate than said interlayer insulating film;

forming the interlayer insulating film so as to be substantially planar and so as to cover the entire surface of said semiconductor device for completing a through-hole; and anisotropically etching said interlayer insulating layer in an opening size smaller than the spacing between the interconnecting;

filling said through-hole with an electrically conductive material.

11. The method as claimed in claim 10, wherein said interlayer insulating film is formed of an $SiO_x$ based material and wherein said sidewall insulating film is formed of at least one insulating material selected from among an $Si_xN_y$ based material, an $Si_xO_yN_z$ based material and an $Al_xO_y$ based material, wherein x, y and z are whole numbers.

12. The method as claimed in claim 10, wherein the opening size of said through-hole is 1 to 1.2 times the applicable minimum processing size.

13. The method as claimed in claim 10, wherein the mid interconnection layer and the lower interconnection layer are a gate electrode and a source/drain region of a MOS transistor, respectively.

14. The method as claimed in claim 10, wherein said electrically conductive material is the same as that of the upper interconnection layer.

15. The method as claimed in claim 10, wherein said electrically conductive material is different than that of the upper interconnection material.

16. The method as claimed in claim 10, further comprising a step of forming a film in the through-hole to obtain an excellent coverage.

* * * * *